United States Patent [19]

Berger et al.

[11] 4,303,839

[45] Dec. 1, 1981

[54] PROCESS FOR FILTERING AN ELECTRICAL SIGNAL BY CHARGE TRANSFER INTO A SEMICONDUCTOR AND SWITCH CAPACITOR FILTER USING SUCH A PROCESS

[75] Inventors: Jean L. Berger; Jean L. Coutures, both of Paris, France

[73] Assignee: Thomson CSF, Paris, France

[21] Appl. No.: 100,483

[22] Filed: Dec. 5, 1979

[30] Foreign Application Priority Data

Dec. 12, 1978 [FR] France .............................. 78 34881

[51] Int. Cl.[3] .................... H03K 3/353; G11C 19/28; H01L 29/78
[52] U.S. Cl. ............................. 307/304; 307/221 D; 357/24
[58] Field of Search ............. 357/24; 307/221 D, 304

[56] References Cited

U.S. PATENT DOCUMENTS

4,070,667 1/1978 Eichelberger .................. 307/221 D
4,072,939 2/1978 Heller et al. .................... 307/221 D

OTHER PUBLICATIONS

Caves et al., "Sampled Analog Filtering Using Switched Capacitors as Resistor Equivalents", IEEE J. Solid-State Circuits, vol. SC-12 (12/77) pp. 592-599.
Mok et al., "A Charge-Transfer-Device Logic Cell", Solid-State Electronics, vol. 17 (10/74) pp. 1147-1154.

Primary Examiner—Gene M. Munson
Attorney, Agent, or Firm—Roland Plottel

[57] ABSTRACT

The process more particularly comprises introducing beneath the final storage capacitor $C_6$ a quantity of charges equal to that located there during the processing of the preceding sample of the input signal, prior to the beginning of charge transfer from said capacitors to the means which convert the charges into a voltage, and distributing the charges between said capacitor and the preceding capacitor as a function of the capacitance values. The switched capacitor filter more particularly comprises, when it is looped, a circuit R permitting the application to the looping capacitor $C_4$ of a voltage $V_g + \Delta V_s$, while the foils of the other storage capacitors of the filter are connected to the voltage $V_g$.

10 Claims, 18 Drawing Figures

FIG_1 PRIOR ART

FIG_3

FIG_4 PRIOR ART

FIG_5

FIG_7

PROCESS FOR FILTERING AN ELECTRICAL SIGNAL BY CHARGE TRANSFER INTO A SEMICONDUCTOR AND SWITCH CAPACITOR FILTER USING SUCH A PROCESS

BACKGROUND OF THE INVENTION

The present invention relates to a process for filtering an electrical signal by the transfer of charges into a semiconductor. It also relates to switched capacitor filters using such a process.

Active filters called switched capacitor filters are known, particularly from two articles in the American "IEEE Journal of solid-state circuits", vol. SC-12, No. 6, December 1977, pp. 592 to 608.

Switched capacitor filters generally have at least one amplifier associated with a network of MOS switches and capacitors, in which the combination of two MOS switches and one capacitor serves as the resistor. Switched capacitor filters have small overall dimensions, as well as high linearity and temperature stability.

The capacitors of switched capacitor filters are integrated in per se known manner by a procedure involving two metallisation levels. Each terminal of the integrated capacitors then has a stray capacitance of non-negligible value in relation to the substrate. The stray capacitances created by the capacitors of the network associated with the amplifier are particularly disadvantageous, because they lead to errors in the frequency response of the filter. It is then necessary to increase the values of the capacitors of the system in order to reduce the effect of stray capacitances, which increases the surface of the semiconductor substrate necessary for producing the filter, and therefore its cost and overall dimensions.

BRIEF SUMMARY OF THE INVENTION

The switched capacitor filters using the filtering process according to the invention have the advantage of not having stray capacitances on the capacitors of the network associated with the amplifier, because they are not produced by the method involving two metallisation levels and instead have a common terminal and connection between the said capacitors takes place by charge transfer. It is therefore possible to use low values for the capacitors of the system so that the cost and overall dimensions of the filter can be reduced.

The invention therefore relates to a process for filtering an electrical signal by transferring charges into a semiconductor substrate, which is covered with a first insulating layer on which is arranged a first group of electrodes constituting with the first insulating layer and the substrate charge storage capacitors, whilst a second group of electrodes is interposed with the first and is separated therefrom by a second insulating layer, the electrodes of said second group constituting with the first group, the second insulating layer and the substrate switches which control the transfer of charges between the storage capacitors, wherein the processing of each sample of the electrical input signal comprises the following stages:

(a) a quantity of charges corresponding to the sample of the electrical input signal during processing is introduced beneath the first capacitor in the charge transfer direction;

(b) beneath the last capacitor in the charge transfer direction is introduced a quantity of charges which is equal to that already there, during the processing of the preceding sample of the electrical input signal and prior to the beginning of the transfer of charges from said last capacitor to means which convert the charges into an electrical voltage;

(c) a common surface potential is established between two successive capacitors, whereby during the said stage the capacitors are brought to a constant potential $V_g$;

(d) the charges are transferred from the last capacitor in the charge transfer direction to means which convert the charges into an electrical voltage.

The order of stages (a) and (b) in the process is random, but stages (a) and (b) must precede stage (c), which must precede stage (d).

In the case of filters of at least the second order, the filter is looped by one of the storage capacitors and the process comprises a supplementary stage (e). During this stage, a common surface potential is established between the looping capacitor and the following capacitor, in the charge transfer direction.

These capacitors are respectively brought to voltages $V_g + \Delta V_s$ and $V_g$, in which $\Delta V_s$ is the variation in the output voltage of the filter for the preceding sample of the electrical input voltage. The order of stages (a), (b) and (e) is random, but these stages must precede stage (c), which must precede stage (d).

BRIEF DESCRIPTION OF THE DRAWINGS

The invention will be described in greater detail hereinafter relative to non-limitative embodiments and with reference to the attached drawings, wherein show.

DETAILED DESCRIPTION OF THE PREFERRED EMBODIMENTS

In the drawings, the same references designate the same components and for reasons of clarity, the dimensions and proportions of the various components have not been respected.

Figure 1:
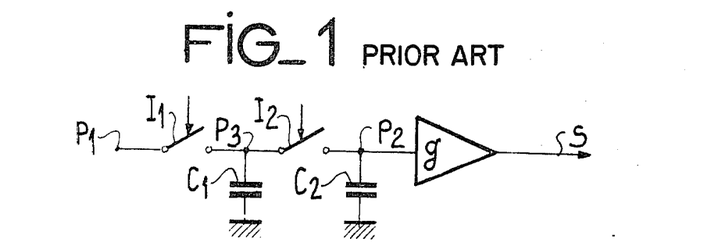
FIG. 1 the diagram of a switched capacitor filter of the first order according to the prior art.

FIG. 1 shows the diagram of a switched capacitor filter of the first order according to the prior art. This filter is of the RC type and has between two points $P_1$ and $P_2$ a resistor by arranging in series two switches $I_1$ and $I_2$ and by a capacitor $C_1$ between the common point $P_3$ of $I_1$ and $I_2$ and earth. This filter also has a capacitor $C_2$ between point $P_2$ and earth and an amplifier of gain g between point $P_2$ and output S of said filter.

Figures 2, 2A:
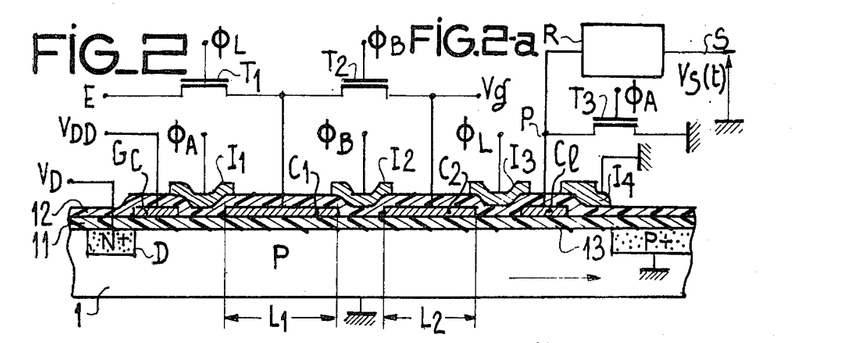
FIGS. 2a to 2f an embodiment of the filter of FIG. 1 in accordance with the present invention and diagrams illustrating the filtering process according to the invention.

FIG. 2a shows an embodiment of the filter of FIG. 1 according to the present invention. FIG. 2a is a cross-sectional view work parallel to the charge transfer direction of the network of capacitors and MOS switches of the filter of FIG. 1, whilst the circuit diagram associated with said system is also shown. The filter according to the invention uses the transfer of charges into a semiconductor substrate 1, covered with a first insulating layer 11 on which is arranged a first group of electrodes, which create with the first insulating layer and the substrate storage capacitors for charges C. A second group of electrodes is interposed with the first group and from which it is separated by a second insulating layer 12. The electrodes of this second group constitute, with the first group, the second insulating layer and the substrate MOS switches I, which control the transfer of charges between storage capacitors.

The semiconductor substrate can be made from silicon, for example of type P and the two groups of electrodes can be of polycrystalline silicon. The second insulating layer 12 is then made by oxidizing the polycrystalline silicon of the first group of electrodes.

The filter shown in FIG. 2a has two storage capacitors $C_1$ and $C_2$, between which is inserted an MOS switch $I_2$. A grid $G_c$, located in the same plane as capacitors $C_1$ and $C_2$, controls the current supplied by a diode D located in the semiconductor substrate and brought to a constant potential $V_D$. The grid $G_C$ is connected to a constant potential $V_{DD}$, which exceeds $V_D$. An MOS switch $I_1$ in the same plane as switch $I_2$ separates grid $G_C$ from the first storage capacitors $C_1$ in the charge transfer direction indicated by an arrow.

Capacitor $C_1$ is connected to the common point of MOS transistors $T_1$ and $T_2$, which are arranged in series and respectively connected to the input signal E and the voltage $V_G$. Capacitor $C_2$ is permanently connected to voltage $V_G$, which is generally of the order of 5 V. The means which convert the charges into an electrical voltage comprise a charge reading capacitor $C_l$, located in the same plane as capacitors $C_1$ and $C_2$ and separated from $C_2$ by MOS switch $I_3$ located in the same plane as switches $I_1$ and $I_2$. These means also comprise a circuit R connected at point P to capacitor $C_l$ and which supplies the output voltage to point S. An MOS transistor $T_3$ is connected between point P and earth.

Following the reading capacitor $C_l$ the surface potential of the substrate is fixed at zero by an MOS switch $I_4$, followed by a type P+ zone which is highly doped and of the same conductivity as the substrate located beneath the substrate surface. Switch $I_4$ and the P+ type zone are raised to the same reference potential as the substrate.

Figure 2B:
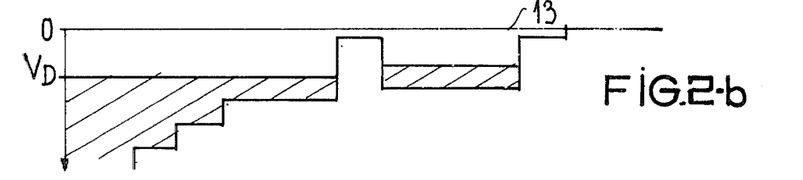

FIGS. 2b, c, d, e and f illustrate the filtering process according to the invention and will now enable us to describe the operation of the filter of FIG. 2a. These drawings show the state of the potential wells created in substrate 1 at various times $t_1$ to $t_5$ and for reasons of clarity only the interface 13 of the substrate with the first insulating layer 11 is shown.

It should also be noted that throughout the description the semiconductor substrate is of the P type and that the transferred charges are minority carriers (electrons). It is obvious that in the case of a type N substrate, in which the holes move, it is merely necessary to reverse the polarity of the potentials applied.

Figure 3:
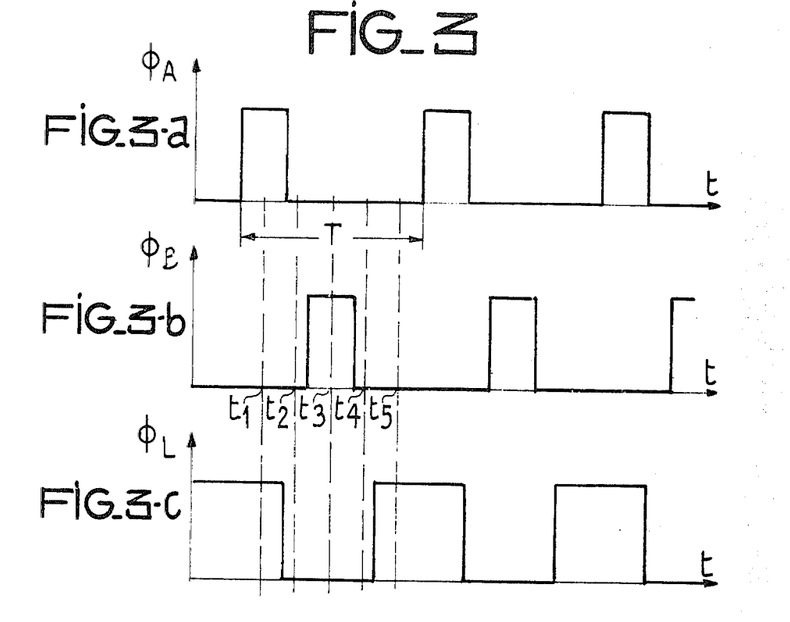
FIGS. 3a to 3c diagrams of the signals liable to be applied to the filter of FIG. 2.

FIG. 3 shows diagrams of signals which can be applied to the filter of FIG. 2a. FIGS. 3a, b and c represent potentials $\phi_A$, $\phi_B$, $\phi_L$ applied to switch $I_1$ and transistor $T_3$ in the case of $\phi_A$, to switch $I_2$ and transistor $T_2$ in the case of $\phi_B$ and to switch $I_3$ and transistor $T_1$ in the case of $\phi_L$. The potentials $\phi_A$, $\phi_B$, $\phi_L$ are periodic functions of the same square-wave cycle T, whose amplitude varies between a low level and a high level. Potentials $\phi_A$ and $\phi_B$ are preferably identical, but phase-displaced in such a way as not to simultaneously be at the high level. Potential $\phi_L$ passes from the high level before $\phi_A$, with $\phi_B$ at the low level and passes to the low level at the same time as $\phi_A$.

FIG. 2b illustrates stage (a) as the process during which a quantity of charges corresponding to the sample of the electrical input signal E during processing is introduced beneath the first capacitor in accordance with the charge transfer direction $C_1$.

Switch $I_1$ and transistor $T_1$ are then conductive, whilst switch $I_2$ and transistor $T_2$ are blocked. A same surface potential equal to $V_D$, the polarisation voltage of diode D, is established beneath the control grid $G_C$ and beneath capacitor $C_1$.

FIG. 2b also illustrates stage (b) of the process during which a quantity of charges equal to that located there during the processing of the preceding sample of the electrical input signal and before the start of the transfer of charges from the last capacitor to the means converting the charges into an electrical voltage is introduced beneath the final capacitor in the charge transfer directions $C_2$.

Transistor $T_3$ is conductive and zeros the reading capacitor $C_l$. Switch $I_3$ is also conductive and the quantity of charges stored beneath $C_l$ is transferred beneath $C_2$, which is subject to potential $V_g$.

The filter of FIG. 2a is in the state shown in FIG. 2b at time $t_1$ indicated at FIG. 3, such that $\phi_A$ and $\phi_L$ are simultaneously at the high level.

Figure 2C:
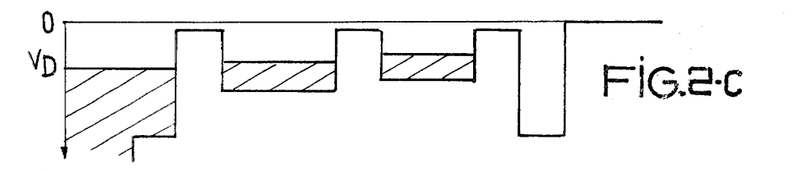

FIG. 2c shows the state of the filter of FIG. 2a at time $t_2$ when all the switches and transistors are blocked.

The surface potential beneath capacitor $C_1$ at time $t_2$ $\phi_{S1}(t_2)$ is substantially equal to its value $V_D$ at time $t_1$.

In an MOS capacitor, the equation at a time t between the voltage V applied to said capacitor, the surface potential $\phi_S$ and the inversion charge Q beneath the capacitor is written:

$$V(t) = \phi_S(t) + 2\sqrt{V_o \phi_S(t)} + \frac{Q(t)}{C}$$

with C being the capacitance value and $$V_o = \frac{\epsilon_S \cdot q \cdot N_A}{C^2}$$

in which $\epsilon_S$ is the dielectric constant of the semiconductor, q the electron charge and $N_A$ the density of the acceptor ions in the semiconductor.

At time $t_2$, the inversion charges beneath the capacitors $C_1$ and $C_2$ are written:

$$\begin{cases} Q_1(t_2) = C_1\left(E(t_2) - V_D - \sqrt{2 V_o V_D}\right) = C_1 \cdot \gamma_1(t_2) \\ Q_2(t_2) = C_2\left(V_g - \phi_{S2}(t_2) - \sqrt{2 V_o \phi_{S2}(t_2)}\right), = C_2 \cdot \gamma_2(t_2) \end{cases} \quad (1)$$

with $\gamma(t) = V(t) - \phi_S(t) - \sqrt{2 V_o \phi_S(t)}$

Figure 2D:
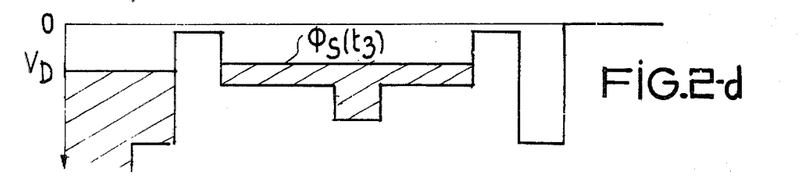

FIG. 2d illustrates stage (c) of the process during which a common surface potential is established between two successive capacitors, whereby during this stage the latter are raised to potential $V_g$.

Switch $I_2$ and transistor $T_2$ are then conductive, whilst switches $I_1$ and $I_3$ and transistor $T_1$ are blocked.

The filter is in the state shown in FIG. 2d at time $t_3$, where only the potential $\phi_B$ is at the high level.

Figure 2E:
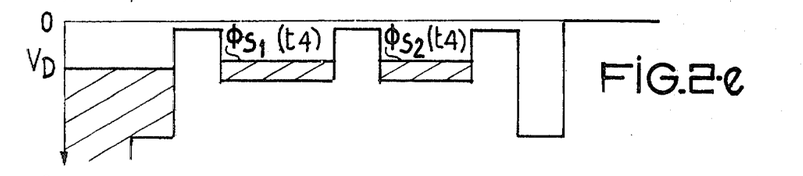

FIG. 2e represents the state of the filter at the time where all the potentials $\phi_A$, $\phi_B$, $\phi_L$ are at the low level.

Beneath capacitors $C_1$ and $C_2$ is established essentially the same surface potential $\phi_{S1}(t_4)$ and $\phi_{S2}(t_4)$, which is substantially equal to $\phi_S(t_3)$, the surface potential common to $C_1$ and $C_2$ at time $t_3$.

From $t_2$ to $t_4$, capacitors $C_1$ and $C_2$ are isolated from the remainder of the semiconductor substrate by switches $I_1$ and $I_3$, which are blocked. It is therefore possible to write:

$$Q_1(t_4) + Q_2(t_4) = Q_1(t_2) + Q_2(t_2) \quad (2)$$

as well as:

$$\gamma_1(t_4) = \gamma_2(t_4) \quad (3)$$

because the capacitors $C_1$ and $C_2$ then receive the same voltage $V_g$ and have substantially the same surface potentials. The distribution of the charges between capacitors $C_1$ and $C_2$ at time $t_4$ is dependent on the values of said capacitors.

At time $t_4$, there is a quantity of charges beneath capacitor $C_2$ which is to be transferred during the following stage of the process (stage d) towards the means which convert the charges into an electrical voltage. This same charge quantity will again be present beneath $C_2$ at time $t_2$ during the processing of the following sample of the electrical input voltage. It is therefore possible to write:

$$C_2\gamma_2(t_2) = C_2\gamma_2(t_4 - T) \quad (4)$$

Equations (2), (3) and (4) make it possible to write:

$$\gamma_2(t_4)(C_1 + C_2) = C_1\gamma_1(t_2) + C_2\gamma_2(t_4 - T)$$

On passing into the frequency range, we obtain:

$$H(\omega) = \frac{\gamma_2(\omega)}{\gamma_1(\omega)} = \frac{(1-\beta)e^{-j\omega\tau}}{1 - \beta e^{-j\omega T}} \quad (5)$$

with $\beta = \dfrac{C_2}{C_1 + C_2}$ and $\tau = t_4 - t_2$.

Figure 2F:
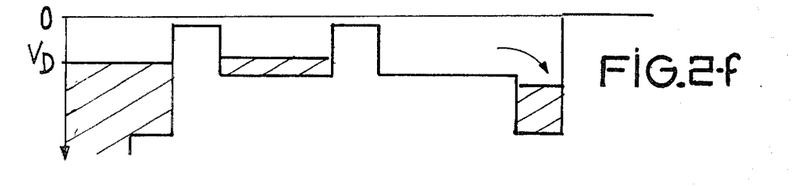

FIG. 2f illustrates the stage of the process in which the charges are transferred from the final capacitor $C_2$ to the means converting the charges into an electrical voltage and more particularly beneath the reading capacitors $C_l$. Switch $I_3$ is conductive and switch $I_2$ blocked.

The filter is in the state shown in FIG. 2f at time $t_5$, when only potential $\phi_L$ is of the high level.

During stage (d) the potential of point P is maintained at a constant value by circuit R, due to the sampling of charges on a capacitor $C_A$.

The output signal variation at point S is:

$$\Delta V_S = -\frac{\Delta Q}{C_A} = -\frac{Q_2(t_4)}{C_A}$$

on ignoring the space charge variation.

On passing into the frequency range and taking account of equations (1) and (5), we obtain:

$$\Delta V_S(\omega) = -\frac{C_2}{C_A} H(\omega) E(\omega)$$

The transfer function of the filter of FIG. 2a is written:

$$P(\omega) = -\frac{C_2}{C_A} \cdot \frac{(1-\beta)e^{-j\omega\tau}}{1 - \beta e^{-j\omega T}}$$

which is the transfer function of the filter of FIG. 1, the gain g of the amplifier being equal to $$-\frac{C_2}{C_A}.$$

The cut-off frequency of the filter according to the invention is regulated by acting on the value of $\beta$ and therefore on the values of capacitors $C_1$ and $C_2$, example by modifying the dimensions $L_1$ and $L_2$ of said capacitors. The order of stages (a) and (b) in the process is unimportant, but these stages must be carried out before stage (c), which in turn must precede stage (d).

Figure 4:
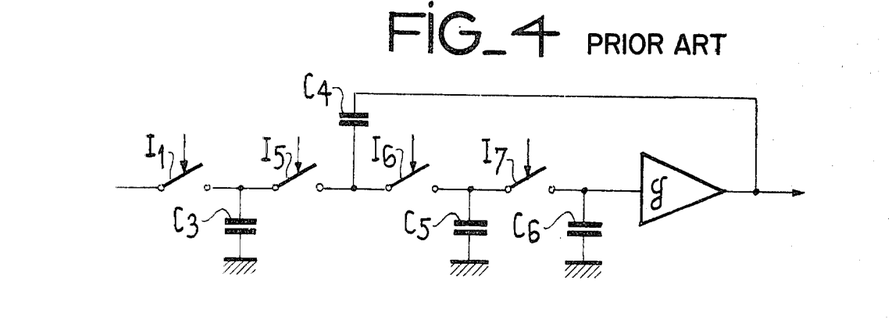
FIG. 4 the diagram of a switched capacitor filter of the second order according to the prior art.

FIG. 4 illustrates the diagram of a switched capacitor filter of the second order according to the prior art. It is a Sallen Key cell having two series resistors constituted by switches $I_1$ and $I_5$ and capacitor $C_3$ for the first resistor and MOS switches $I_6$ and $I_7$ and capacitor $C_5$ for the second resistor. A capacitor $C_6$ is connected between one of the terminals of the second resistor and earth, said terminal being connected to the input of an amplifier of gain g, whose output is returned by means of a capacitor $C_4$ to the common point of the two resistors.

Figure 5:
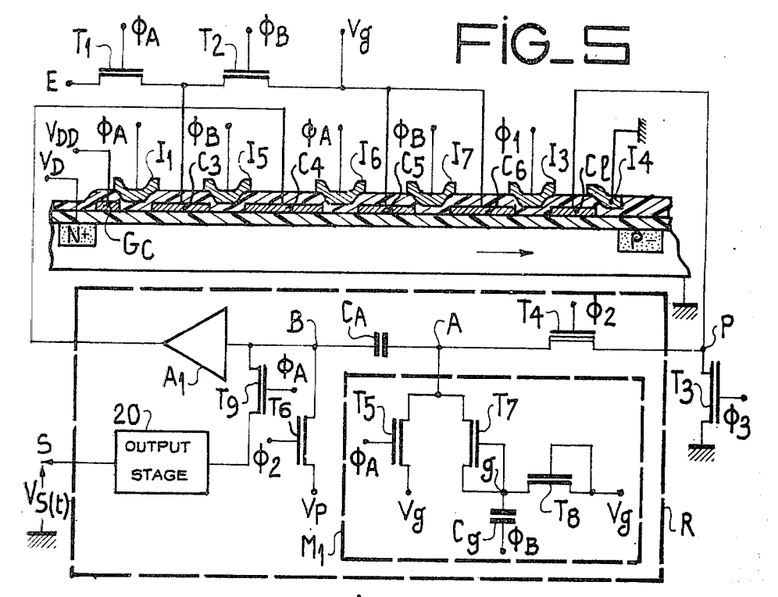
FIG. 5 an embodiment of the filter of FIG. 4 according to the present invention.

FIG. 5 shows an embodiment according to the invention of the filter of FIG. 4. A network of capacitors and switches of the filter of FIG. 4 is shown in cross-sectional form, parallel to the charge transfer direction indicated by an arrow. FIG. 5 also shows the circuit diagram for this system.

The filter shown in FIG. 5 differs from that of FIG. 2a in that instead of two it has four storage capacitors $C_3$, $C_4$, $C_5$, $C_6$, separated by MOS switches $I_5$, $I_6$, $I_7$.

The foils of capacitors $C_5$ and $C_6$ are connected to $V_g$, so that capacitor $C_4$ used for the looping of the filter during stage (e) of the process receives a voltage equal to $V_g + \Delta V_S$ in which $\Delta V_S$ is the variation in the output voltage of the filter for the preceding sample of the input signal.

During stage (e) a common surface potential is established between capacitor $C_4$ and the following capacitor $C_5$, which is raised to potential $V_g$. Capacitor $C_4$ receives the potential $V_g + \Delta V_S$ from a point B located within the circuit R belonging to the means which convert the charges into electrical voltages and whose circuit diagram will be described in greater detail hereinafter. This circuit R differs from that used for the filter of FIG. 2, which is not looped.

The order of stages (a), (b) and (e) is unimportant, but stages (a), (b) and (e) must be carried out before stage (c), which must precede stage (d).

Circuit R has an MOS transistor $T_4$ in series with one of the terminals of a capacitor $C_A$. A control circuit $M_1$ is connected to the connecting point A of transistor $T_4$ and capacitor $C_A$. The other terminal of capacitor $C_A$ is connected to a point B, whilst an MOS transistor $T_6$ is connected between point B and a fixed potential $V_p$. Point B is connected to capacitor $C_4$, which ensures the looping of the filter by means of a following stage or an amplifier of unity gain $A_1$. Between point B and a point S, it is possible to connect a transistor $T_9$ controlled by $\phi_A$ and an output stage 20, which ensures the locking and the maintenance of the output voltage at S.

Control circuit $M_1$ has a transistor $T_5$ between point A and potential $V_g$ and a transistor $T_7$ between point A and a point g. The grid of $T_7$, a capacitor $C_g$ and a transistor $T_8$, whose two other terminals are raised to $V_g$ are also connected at point g.

Figure 6:
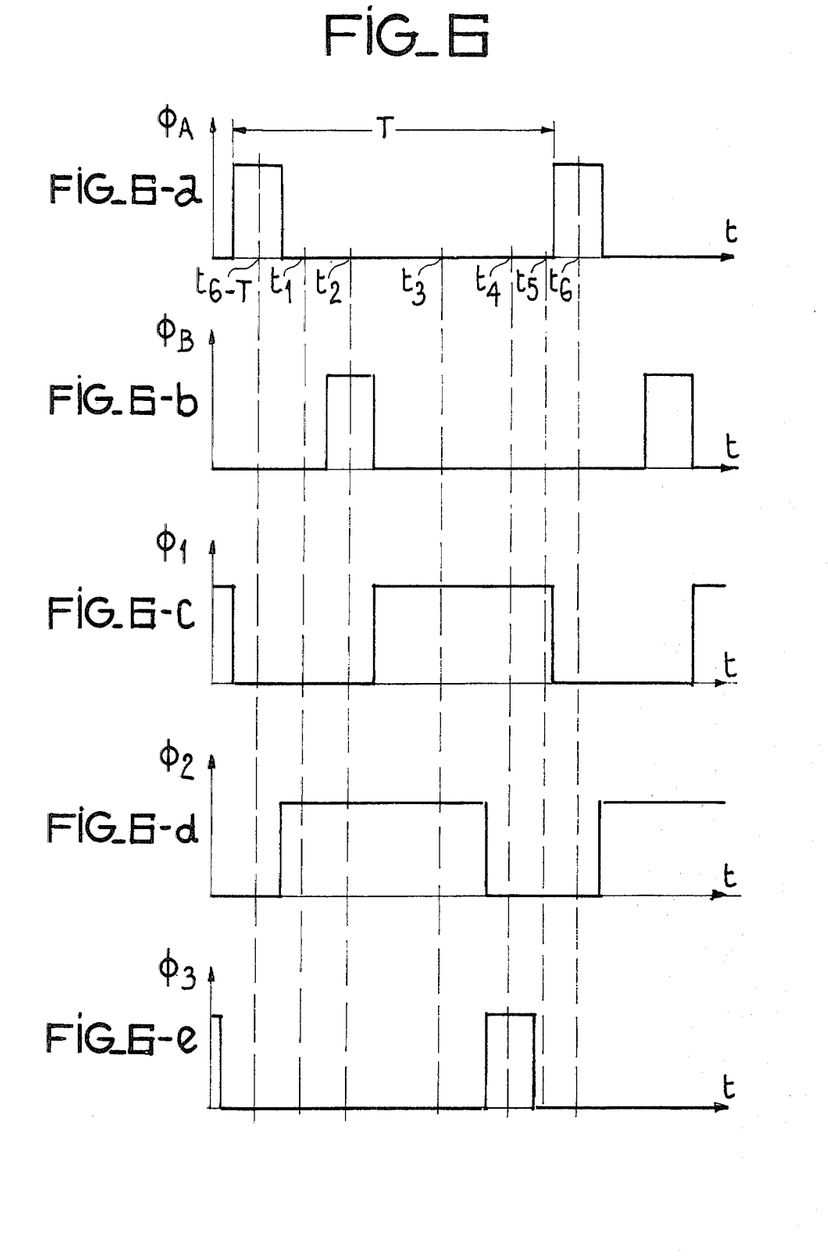
FIGS. 6a to 6e diagrams of the signals likely to be applied to the filter of FIG. 5.

FIG. 6 shows diagrams of the signals liable to be applied to the filter of FIG. 5. FIGS. 6a, b, c, d and e show potentials $\phi_A$, $\phi_B$, $\phi_1$, $\phi_2$, $\phi_3$ applied to switches $I_1$ and $I_6$ and to transistors $T_1$, $T_5$ and $T_9$ in the case of $\phi_A$, to switches $I_5$, $I_7$, transistor $T_2$ and capacitor $C_g$ in the case of $\phi_B$, to switch $I_3$ in the case of $\phi_1$, to transistors $T_4$ and $T_6$ in the case of $\phi_2$ and finally to transistor $T_3$ in the case of $\phi_3$.

Like the potentials shown in FIG. 3, potentials $\phi_A$, $\phi_B$, $\phi_1$, $\phi_2$, $\phi_3$ are periodic functions of the same cycle T, which is of the square-wave type and whose amplitude can vary between a low level and a high level. Potentials $\phi_A$ and $\phi_B$ are preferably identical, but phase-displaced so that they are not simultaneously conductive. Potential $\phi_1$ passes to a high level, when $\phi_B$ is at the low level and in the embodiment of FIG. 6 $\phi_1$ is at the high level during the period of time when $\phi_A$ and $\phi_B$ are at the low level. Potential $\phi_2$ passes to the high level when $\phi_A$ is at the low level and passes to the low level when $\phi_1$ is still at the high level. Potential $\phi_3$ passes to the high level when $\phi_2$ is at the low level and $\phi_1$ at the high level and passes to the low level before or at the same time as $\phi_1$.

At time $t_1$ shown in FIG. 6, $\phi_2$ is at the high level. Transistor $T_4$ functions as a triode, establishing the same potentials at points A and P. Point B is raised to a potential $V_p$ by transistor $T_6$.

At time $t_2$, $\phi_B$ and $\phi_2$ are at the high level. Stage (c) of the process is performed. Transistor $T_6$ is conductive and the voltage at point B is equal to $V_p$. It is necessary to choose $V_p = V_g$, so that the capacitor $C_4$ is raised to the potential $V_g$ during stage (c). Capacitor $C_g$ transmits to point g the voltage swing $V_{\phi B}$ of the potential $\phi_B$. Thus, point g passes from $v_g - V_{T8}$ to $V_g - V_{T8} + V_{\phi B}$, in which $V_{T8}$ is the threshold voltage of transistor $T_8$. Transistor $T_7$ starts to become conductive and charges the capacitors $C_A$ and $C_l$, provided that $C_g >> C_A + C_l$ until the time when transistor $T_4$ is saturated, thus fixing the potential of point P at $V_{\phi 2} - V_{T4}$, in which $V_{\phi 2}$ corresponds to the high level of potential $\phi_2$ and in which $V_{T4}$ is the threshold voltage of $T_4$, which is negative because $T_4$ is an MOS depletion transistor, whilst the other transistors of the circuit are enhancement transistors, whose threshold voltages $V_T$ are positive. Point A is at potential $V_{AO} = V_g + V_{\phi B} - V_{T8} - V_{T7}$.

At time $t_3$, $\phi_1$ and $\phi_2$ are at the high level and stage (d) of the process takes place. The quantity of charges present beneath the final capacitor $C_6$ in the charge transfer direction passes beneath the reading capacitor $C_I$. The potential of point P is kept constant by $T_4$, due to a supply of charges sampled from capacitor $C_A$, the transistor $T_7$ being blocked from the passage of $\phi_B$ to the low level.

The potential at A becomes:

$$V_A = V_{AO} - \frac{Q_6(t_3)}{C_A} = V_{AO} - \Delta V_S,$$

-continued $$\text{with } \Delta V_S = \frac{-C_6}{C_A} H(\omega) \cdot E(\omega),$$

as hereinbefore, E ($\omega$) being the signal present at the input of the filter and H ($\omega$) being the transfer function of the filter of the second order obtained by switching capacitors $C_3$, $C_4$, $C_5$, $C_6$. The form of said transfer function is fixed by the values of the capacitor $C_3$, $C_4$, $C_5$, $C_6$ and the gain value of loop $$g = \frac{-C_6}{C_A}.$$

The processing of a further input signal sample then commences.

Time $t_4$, $\phi_1$ and $\phi_3$ are at high level and stage (b) of the process takes place. The return to the low level of $\phi_2$ provides the blocking of $T_6$ and $T_4$, point B assumes a floating state and points A and P are separated. Point P is connected to the reference potential by $T_3$ and the quantity of charges $Q_6(t_3)$ is restored by reading capacitor $C_I$ beneath the final capacitor $C_6$.

At time $t_6$, $\phi_A$ is at the high level and stages (a) and (e) of the process take place. The potential of point A is raised to $V_g$, so that the potential of point B becomes: $V_B = V_g + V_p - V_A = V_g + V_p - V_{AO} + \Delta V_S$.

It is necessary to choose $V_p$ equal to $V_{AO}$ in order to obtain at point B a voltage equal to $V_g + \Delta V_S$ in which $\Delta V_S$ is the variation of the output signal of the filter for the preceding signal sample. Transistor $T_9$ is conductive and transmits the voltage $V_g + \Delta V_S$ to capacitor $C_4$. The gain g of the amplifier of FIG. 4 is equal to $$-\frac{C_6}{C_A}.$$

The output signal is also available at point S.

Figure 7:
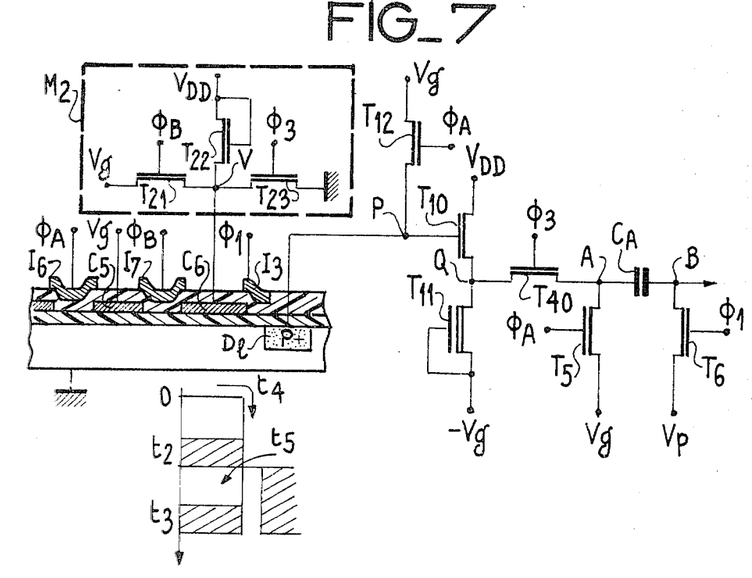
FIG. 7 another embodiment of the filter of FIG. 4 according to the invention and diagrams illustrating its operation.

FIG. 7 shows another embodiment of the filter of FIG. 4 according to the present invention and to which can be applied the signals shown in FIG. 6.

This embodiment differs from that of FIG. 5, because the final capacitor $C_6$ is not permanently connected to potential $V_g$. In FIG. 7, capacitor $C_6$ is connected to a control circuit $M_2$, permitting the raising thereof to potential $V_{DD}$ during stage (b) to potential $V_g$ during stage (c) and to reference potential during stage (d). The circuit $M_2$ has three transistors connected to the capacitor $C_6$ at a point V and also connected to voltage $V_g$ for transistor $T_{21}$, to voltage $V_{DD}$ for transistor $T_{22}$, whose grid is also raised to $V_{DD}$ and to the reference voltage for transistor $T_{23}$. This embodiment also differs from that of FIG. 5 through the means which convert the charges into an electrical voltage. These means comprise a reading diode integrated into the semiconductor substrate and separated from the final capacitor $C_6$ by a switch $I_3$. Diode $D_I$ is connected to a point P, to which is connected a transistor $T_{12}$, which is also connected to voltage $V_g$ and a gain stage k, which can be a following stage constituted by a transistor $T_{10}$, whose grid is connected to point P and connected between voltage $V_{DD}$ and a point Q, and by an MOS depletion transistor $T_{11}$ between point Q and voltage $-V_g$, whereby the grid of $T_{11}$ is also connected to $-V_g$. Between point Q and point B, a transistor $T_{40}$ is arranged in series with one of the terminals of a capacitor $C_A$, whose other terminal is connected to a point B. Between the common point A of $T_{40}$ and $C_A$ is positioned a transistor $T_5$, which is also connected to Vg. A transistor $T_6$ is connected between point B and potential $V_p$. As from point B, the circuit diagram is identical to that of the embodiment shown in FIG. 5.

Compared with the embodiment of FIG. 5, potential $\phi_A$ is also applied to transistor $T_{12}$, potential $\phi_B$ to transistor $T_{21}$, potential $\phi_1$ to transistor $T_6$ and potential $\phi_3$ to transistors $T_{23}$ and $T_{40}$.

At time $t_2$, stage (c) of the process takes place. Transistor $T_{21}$ is conductive and raises the final capacitor $T_6$ to potential $V_g$.

At time $t_3$, the final capacitor $C_6$ is raised to potential $V_{DD}$ of the order of 12 V by transistor $T_{22}$. Switch $I_3$ receives the high level of potential $\phi_1$, which is equal to $V_g$ and of the order of 5 V. The low level of $\phi_1$ is taken as being equal to the reference potential.

The level of the potentials beneath $C_6$ is higher than the level of the potentials beneath switch $I_3$, as is diagrammatically shown in FIG. 7 which represents the state of the potential walls beneath $C_6$, $I_3$ and $D_I$ at times $t_2$, $t_3$, $t_4$ and $t_5$. At time $t_3$, the transfer of charges from $C_6$ to $D_I$ cannot take place. At time $t_3$, point B is raised to a potential $V_p$ by transistor $T_6$.

At time $t_4$, stage (d) of the process takes place. Capacitor $C_6$ is raised to the reference potential by transistor $T_{23}$ for which purpose the latter must be much more conductive than $T_{22}$. There is a transfer of charges from $T_6$ to beneath diode $D_I$, whose potential was restored to $V_g$ at time $t_6$-T indicated in FIG. 6. Transistor $T_{40}$ is conductive and capacitor $C_A$ is charged. The voltage swing at A is equal to $$\Delta V_A = V_A - V_{AO} = -k\frac{Q_6}{C_D}$$

in which k is the gain of the following stage, $Q_6$ the quantity of charges present beneath $C_6$ at time $t_3$ and $C_D$ the capacitance of point P. The following stage can be replaced by an amplifier of gain k equal to 1.

The processing of a further input signal sample starts at time $t_5$. Stage (b) of the process takes place. Potential $\phi_3$ is at the low level, transistor $T_{40}$ separates points A and Q and transistor $T_{22}$ raises the capacitor $C_6$ to the potential $V_{DD}$. Charges $Q_6$ are transferred from $D_I$ to beneath $C_6$.

At time $t_6$, stages (a) and (e) of the process take place. Point A is raised to potential $V_g$ by $T_5$ and the potential of point B becomes:

$$V_B = V_g + V_p - V_A = V_g + V_p + k\frac{Q_6}{C_D} - V_{AO}$$

It is therefore merely necessary to select potential $V_p$ equal to $V_{AO}$ to obtain $$V_B = V_g + k\frac{Q_6}{C_D} = V_g + \Delta V_s$$

in which $\Delta V_S$ is the variation of the output voltage of the filter for the preceding sample of the electrical input signal. At time $t_6$, diode $D_I$ is restored to potential $V_g$ by $T_{12}$, so that gain g is equal to $$-k\frac{C_6}{C_D}.$$

All the transistors used in the invention are preferably MOS enhancement transistors, except for transistors $T_{11}$ and $T_4$, which are MOS depletion transistors.

The invention is not limited to the embodiments described and represented hereinbefore and various modifications can be made thereto without passing beyond the scope of the invention.

What is claimed is:

1. A switched capacitor filter using a process for filtering an electrical signal by transferring charges into a semiconductor substrate, which is covered with a first insulating layer on which is arranged a first group of electrodes constituting with the first insulating layer and the substrate charge storage capacitors, whilst a second group of electrodes is interposed with the first and is separated therefrom by a second insulating layer, the electrodes of said second group constituting with the first and the second insulating layers and the substrate switches which control the transfer of charges between the storage capacitors, wherein the processing of each sample of the electrical input signal comprises the following stages:
 (a) a quantity of charges corresponding to the sample of the electrical input signal during processing is introduced beneath the first capacitor ($C_3$) in the charge transfer direction;
 (b) beneath the last capacitor ($C_6$), in the charge transfer direction is introduced a quantity of charges which is equal to that already there, during the processing of the preceding sample of the electrical input signal and prior to the beginning of the transfer of charges from said last capacitor to means which convert the charges into an electrical voltage;
 (c) a common surface potential is established between two successive capacitors, whereby during the said stage the capacitors are brought to a constant potential $V_g$;
 (d) the charges are transferred from the last capacitor in the charge transfer direction to means which convert the charges into an electrical voltage; the order of stages (a) and (b) in the process is random, but stages (a) and (b) must precede stage (c), which must precede stage (d); wherein said filter comprises a diode (D) located in the semiconductor substrate (1) and raised to a constant potential $V_D$ and a grid ($G_C$) located in the same plane as the storage capacitors ($C_3$, $C_4$, $C_5$, $C_6$) and raised to a constant potential $V_{DD}$ which exceeds $V_D$, which controls the current supplied by the diode, the grid being separated from the first capacitor in the charge transfer direction by a switch $I_1$ located in the same plane as the other switches ($I_5$, $I_6$, $I_7$) and the first capacitor being connected to the common point of two transistors $T_1$ and $T_2$, arranged in series, and respectively connected to the input signal E and to the voltage $V_g$, transistors $T_1$ and $T_2$ and switch $I_1$ being subject to periodic potentials ($\phi_A$, $\phi_B$) such that during stage (a) of the process, transistor $T_1$ is conductive and switch $I_1$ is switched off and during stage (c) transistor $T_2$ conducts.

2. A switched capacitor filter using a process for filtering an electrical signal by transferring charges into a semiconductor substrate, which is covered with a first insulating layer on which is arranged a first group of electrodes constituting with the first insulating layer and the substrate charge storage capacitors, whilst a second group of electrodes is interposed with the first and is separated therefrom by a second insulating layer the electrodes of said second group constituting with the first and the second insulating layers and the substrate switches which control the transfer of charges between the storage capacitors, wherein the processing of each sample of the electrical input signal comprises the following stages:

(a) a quantity of charges corresponding to the sample of the electrical input signal during processing is introduced beneath the first capacitor ($C_3$) in the charge transfer direction;

(b) beneath the last capacitor ($C_6$), in the charge transfer direction, is introduced a quantity of charges which is equal to that already there, during the processing of the preceding sample of the electrical input signal and prior to the beginning of the transfer of charges from said last capacitor to means which convert the charges into an electrical voltage;

(c) a common surface potential is established between two successive capacitors, whereby during the said stage the capacitors are brought to a constant potential $V_g$;

(d) the charges are transferred from the last capacitor in the charge transfer direction to means which convert the charges into an electrical voltage;

(e) during the processing of each sample of the electrical input signal, a common surface potential is established between one of the storage capacitors of the charges, ensuring the looping of the filter, and the following capacitor in the charge transfer direction, said capacitors being respectively raised during said stage to voltages $V_g+\Delta V_S$ and $V_g$, in which $\Delta V_S$ is the variation of the output voltage of the filter for the preceding sample of the input signal, the order of the stages (a), (b), and (e) of the process being random, but stages (a), (b), and (e) must precede stage (c) which in turn must precede stage (d); wherein said filter comprises a diode (D) located in the semiconductor substrate (1) and raised to a constant potential $V_D$ and a grid ($G_G$) located in the same plane as the storage capacitors ($G_3$, $G_4$, $G_5$, $G_6$) and raised to a constant potential $V_{DD}$ which exceeds $V_D$, which controls the current supplied by the diode, the grid being separated from the first capacitor in the charge transfer direction by a switch $I_1$ located in the same plane as the other switches ($I_5$, $I_6$, $I_7$) and the first capacitor being connected to the common point of two transistors $T_1$ and $T_2$, arranged in series, and respectively connected to the input signal E and to the voltage $V_g$, transistors $T_1$ and $T_2$ and switch $I_1$ being subject to periodic potentials ($\phi_A$, $\phi_B$) such that during stage (a) of the process, transistor $T_1$ is conductive and switch $I_1$ is switched off and during stage (c) transistor $T_2$ conducts.

3. A switched capacitor filter according to claim 1 or to claim 2, wherein the means which convert the charges into an electrical voltage comprise a charge reading capacitor $C_l$ located in the same plane as the other storage capacitors and separated from the last storage capacitor ($C_6$) in the charge transfer direction, by a switch $I_3$ located in the same plane as the other switches, the surface potential of the substrate being fixed at zero after the reading capacitor by a switch $I_4$ located in the same plane as the other switches, followed by a zone of the same conductivity as the substrate, but which is strongly doped and which is located beneath the substrate surface, switch $I_4$ and the highly doped zone being raised to the reference potential of the substrate, wherein the reading capacitor is connected at point P to a circuit R which, during stage (d), maintains point P at a constant potential, by sampling charges from a capacitor $C_A$ and supplying the output voltage $V_s(t)$ of the filter.

4. A filter according to claim 3, wherein the circuit R has, connected to point P, a transistor $T_4$ in series with one of the terminals of capacitor $C_A$, a control circuit $M_1$ being connected to the common point A of the transistor and the capacitor and a transistor $T_6$ being connected between the other terminal of the capacitor, point B and a fixed potential $V_p$ and wherein the transistors $T_4$ and $T_6$ and the control circuit $M_1$ are subject to periodic potentials ($\phi_2$, $\phi_A$, $\phi_B$) such that successively;

point B is raised to the potential $V_p$ by transistor $T_6$ control circuit $M_1$ ensures the charging of capacitor $C_A$ and the reading capacitor $C_l$ across transistor $T_4$ and then the saturation of transistor $T_4$ during stage (d) the saturated transistor $T_4$ maintains a constant potential at point P by sampling charges from capacitor $C_A$ and the potential of point A initially at $V_{AO}$ decreases;

the blocking of transistors $T_6$ and $T_4$ leads to a floating potential at point B and separates points A and P;

during stage (e) of the process point A is raised to potential $V_g$ by control circuit $M_1$ and the potential at point B, with potentials $V_p$ and $V_{AO}$ being equal, is $V_g+\Delta V_S$ in which $\Delta V_S$ is the variation of the output voltage of the filter for the preceding sample of the electrical input signal, said potential $V_g+\Delta V_S$ being applied to the capacitor ($C_4$), which ensures the looping of the filter.

5. A filter according to claim 4, wherein the control circuit $M_1$ has a transistor $T_5$ between point A and the fixed potential $V_g$ and a transistor $T_7$ between point A and a point g, the grid of $T_7$ being connected to point g, in the same way as a capacitor $C_g$ and a transistor $T_8$, these two other terminals are raised to potential $V_g$, the grid of $T_5$ and capacitor $C_g$ periodically receiving the given potentials ($\phi_A$, $\phi_B$).

6. A filter according to claim 4, wherein the transistor $T_4$ is of the MOS depletion type.

7. A filter according to claim 3, wherein a transistor $T_3$ is connected between point P and the reference voltage, said transistor $T_3$ periodically receiving at its grid a given potential $\phi_3$, which brings about the performance of stage (b).

8. A filter according to claim 1 or claim 2, wherein the last storage capacitor, in the charge transfer direction $C_6$ is connected to a control circuit $M_2$ and wherein the means which convert the charges into voltages comprise a reading diode $D_l$ integrated into the semiconductor substrate and separated from the last capacitor by a switch $I_3$, located in the same plane as the other switches, the diode $D_l$ being connected to a point P where a transistor $T_{12}$ is connected between point P and potential $V_g$, and a gain stage k is connected between point P and point Q, a transistor $T_{40}$ being arranged in series with one of the terminals of a capacitor $C_A$ between point Q and point B, a transistor $T_5$ between the common point A of $T_{40}$ and $C_A$ and potential $V_g$ and a transistor $T_6$ being connected between point B and potential $V_p$, control circuit $M_2$, switch $I_3$ and transistors $T_{40}$, $T_5$ and $T_6$ being subject to periodic potentials ($\phi_A$, $\phi_B$, $\phi_1$, $\phi_3$) such that successively:

the control circuit $M_2$ raises the final capacitor to potential $V_g$ and stage (c) takes place the control circuit $M_2$ raises the final capacitor to a potential $V_{DD}$, switch $I_3$ to potential $V_g$ and point B to potential $V_p$ by transistor $T_6$;

the control circuit $M_2$ raises the final capacitor to the reference potential and stage (d) takes place, whilst the potential at point A which is initially at $V_{AO}$ developes the blocking of transistor $T_{40}$ separates points A and Q, the control circuit $M_2$ raises the final capacitor to potential $V_{DD}$ and stage (b) takes place;

stages (a) and (e) take place, point A is raised to potential $V_g$ by transistor $T_5$, the potential of point B with potentials $V_p$ and $V_{AO}$ being equal, is equal to $V_g + \Delta V_S$ in which $\Delta V_S$ is the variation of the output voltage of the filter for the preceding sample of the input signal, said potential $V_g + \Delta V_S$ being applied to the capacitor $C_4$, which ensures the looping of the filter, and finally $D_I$ is restored to potential $V_g$ by transistor $T_{12}$.

9. A filter according to claim 8, wherein the control circuit $M_2$ has three transistors connected on the one hand to the final capacitor $C_6$ at the point V and on the other to the potential $V_g$ for transistor $T_{21}$, to potential $V_{DD}$ for transistor $T_{22}$, whose grid is connected to $V_{DD}$ and to reference potential for transistor $T_{23}$, transistors $T_{21}$ and $T_{23}$ periodically receiving the given potentials ($\phi_B$ and $\phi_3$) at their grids.

10. A filter according to claim 1 or to claim 2, wherein the transistors are of the MOS type.

* * * * *